US007260758B1

(12) United States Patent
Agrawal et al.

(10) Patent No.: US 7,260,758 B1
(45) Date of Patent: Aug. 21, 2007

(54) METHOD AND SYSTEM FOR PERFORMING BUILT-IN SELF-TEST ROUTINES USING AN ACCUMULATOR TO STORE FAULT INFORMATION

(75) Inventors: Ghasi R. Agrawal, San Jose, CA (US); Mukesh K. Puri, Fremont, CA (US); William Schwarz, Austin, TX (US)

(73) Assignee: LSI Corporation, Milpitas, CA (US)

( * ) Notice: Subject to any disclaimer, the term of this patent is extended or adjusted under 35 U.S.C. 154(b) by 1011 days.

(21) Appl. No.: 09/949,399

(22) Filed: Sep. 7, 2001

(51) Int. Cl.
*G01R 31/28* (2006.01)
(52) U.S. Cl. .................................................. 714/733
(58) Field of Classification Search ................ 714/733, 714/734, 718, 723; 365/201, 200
See application file for complete search history.

(56) References Cited

U.S. PATENT DOCUMENTS 5,570,376 A * 10/1996 Kunda et al. ................ 714/736
5,831,989 A * 11/1998 Fujisaki ....................... 714/723
6,067,262 A *  5/2000 Irrinki et al. ................ 365/201

* cited by examiner

*Primary Examiner*—James C. Kerveros
(74) *Attorney, Agent, or Firm*—Suiter Swantz PC LLO

(57) ABSTRACT

A test system includes a built-in self-test (BIST) circuit and a stress applicator for use in analyzing a memory array. The stress applicator applies a selective set of stress factors to the memory array, such as temperature and voltage conditions. The BIST circuit executes a test routine on the memory array to detect the presence of any faulty memory address locations that may arise under the prevailing stress condition. A full testing cycle involves iterative repetition of the functions performed by the stress applicator and BIST circuit, with variations in the stress factors across the testing iterations. An accumulator cumulatively stores the fault information generated by the BIST circuit during each testing iteration. Following completion of the testing cycle, a repair operation is performed by a built-in self-repair (BISR) circuit to remap the faulty memory address locations indicated by the accumulator to redundant memory address locations.

22 Claims, 4 Drawing Sheets

METHOD AND SYSTEM FOR PERFORMING BUILT-IN SELF-TEST ROUTINES USING AN ACCUMULATOR TO STORE FAULT INFORMATION

BACKGROUND OF THE INVENTION

1. Field of the Invention

The present invention relates to the testing and repair of integrated circuit dies, and, more particularly, to a method and system for cumulatively storing memory fault information produced during successive iterations of a manufacturing test cycle involving a stress procedure that introduces stress factors into the die and a test routine that executes built-in self-test (BIST) algorithms, followed by an overall global self-repair procedure that is conducted using the cumulatively stored fault information.

2. Description of the Related Art

Integrated circuits have become key components of many consumer and commercial electronic products, often replacing discrete components and enhancing functionality. The semiconductor processing technologies that produce these integrated circuits have advanced to the point where complete systems, including memories, can be reduced to a single integrated circuit or application specific integrated circuit (ASIC) device. It is a common practice for the manufacturers of such integrated circuits to thoroughly test device functionality at the manufacturing site. Because of the increasing complexity of new designs, test development costs now account for a large percentage of the total ASIC development cost.

Before integrated circuits (or "chips") are released for shipment by a manufacturer, the devices typically undergo a variety of testing procedures. In ASIC devices incorporating integrated memories, for example, specific tests are carried out to verify that each of the memory cells within the integrated memory array(s) is functioning properly. This testing is necessary because perfect yields are difficult to achieve.

It is not uncommon for a certain percentage of unpackaged ASIC die to contain memory cells which fail testing processes, due largely to non-systemic manufacturing defects and degradation faults. Such manufacturing issues are likely to increase as process geometries continue to shrink and the density of memory cells increases. Even today, up to 100 Mbits or more of dynamic random access memory (DRAM), or several megabits of static random access memory (SRAM) or flash memory, as well as mixed-signal functions can be integrated onto a single integrated circuit.

A number of ASIC memory testing strategies have evolved, many of which involve the use of an external memory tester or Automated Test Equipment (ATE). If memory is accessible from input/output (I/O) pins, either directly or by multiplexing, a hardware test mode can be utilized. In this mode, a production test system accesses the memory directly by writing to and reading from the memory bits. While this methodology does not utilize any chip area other than some simple multiplexing circuitry, it is limited to on-chip memories and other circuitry accessible via I/O pins. Another drawback of this approach is that ATE capabilities are generally not available to end users once the devices have been shipped, making it difficult to detect faults occurring after shipment.

If an embedded memory is buried deeply within an ASIC, built-in self-test (BIST) is often considered the most practical and efficient test methodology and is becoming increasingly popular with semiconductor vendors. BIST allows the memory to be tested quickly with a reasonably high degree of fault coverage, without requiring complex external test equipment and large amounts of external access circuitry. One advantage BIST has over many traditional testing methods is that with BIST, memory or logic circuitry can be tested at any time in the field. This capability offers some degree of continued fault protection.

BIST refers in general to any test technique in which test vectors are generated internally to an integrated circuit or ASIC. Test vectors are sequences of signals that are applied to integrated circuitry to determine if the integrated circuitry is performing as designed. BIST can be used to test memories located anywhere on the ASIC without requiring dedicated I/O pins, and can be used to test memory or logic circuitry every time power is applied to the ASIC, thereby allowing an ASIC to be easily tested after it has been incorporated in an end product.

A number of software tools exist for automatically generating BIST circuitry, including RAMBIST Builder by LSI Logic of Milpitas, Calif. Such software produces area-efficient BIST circuitry for testing memories, and reduces time-to-market and test development costs.

In the BIST approach, a test pattern generator and test response analyzer are incorporated directly into the device to be tested. BIST operation is controlled by supplying an external clock and utilizing a simple commencement protocol. BIST test results are typically compressed—usually to the level of "passed" or "failed". At the end of a typical structured BIST test, or "run", a simple pass/fail signal is asserted, indicating whether the device passed or failed the test. Intermediate pass/fail signals may also be provided, allowing individual memory locations or group of locations to be analyzed.

Unlike external testing approaches, at-speed testing with BIST is readily achieved. BIST also alleviates the need for long and convoluted test vectors and may function as a surrogate for functional testing or scan testing. Further, since the BIST structures remain active on the device, BIST can be employed at the board or system level to yield reduced system testing costs, and to reduce field diagnosis and repair costs.

In addition to the aforementioned testing procedures, manufacturers utilize a number of techniques to repair faulty memories when feasible. Such techniques include bypassing defective cells using laser procedures and fused links that cause address redirection. However, these techniques may leave integrated circuits useless if the repaired memories become defective after shipment from the manufacturing site.

In order to enhance the repair process, on-chip built-in self repair (BISR) circuitry for repairing faulty memory cells has evolved. BISR circuitry functions internal to the integrated circuit without detailed interaction with external test or repair equipment. In the BISR approach, suitable test algorithms are preferably developed and implemented in BIST or BIST-like circuitry.

These test patterns may be capable of detecting stuck-at, stuck-open, and bridging faults during memory column tests, as well as memory cell faults and retention faults during memory row tests. Following execution of the test patterns, the BISR circuitry analyzes the BIST "signature" (results) and, in the event of detected faults, automatically reconfigures the defective memory utilizing redundant memory elements to replace the defective ones. A memory incorporating BISR is therefore defect-tolerant.

BISR compliments BIST because it takes advantage of on-chip processing capabilities to re-route bad memory bits. Some BISR circuitry is capable of repairing the faulty memory locations by redirecting the original address locations of faulty memory lines to the mapped addressed locations of the redundant columns and rows. Options for repair include either row and column replacement when a bad bit is found in a particular row or column, or single bit replacement involving storing the addresses of bad bits in a Content Addressable Memory (CAM). If faults are randomly distributed, single bit replacement may prove to be more space efficient. However, if faults are detected involving large areas of memory in the forms of rows or columns, replacement of entire rows or columns is preferable.

During the testing process, it is often desirable to separate so-called "prime die" (integrated circuit die in which no redundant BISR memory components were utilized during initial testing) from "repaired die". Separating integrated circuit die in this manner provides an indication of quality and fault tolerance. Because the BIST and BISR circuitry of an integrated circuit continue to be functional in the field, any BISR redundancy resources not expended during initial testing are available to repair faults that may occur in the field. As a consequence, prime die have a higher degree of fault tolerance, and can often be sold by manufacturers for a premium.

A key feature of any integrated circuit is its reliability. Engineers strive to design integrated circuits that operate under a range of conditions (including temperatures and voltages) without malfunctioning. Therefore, it is often desirable to test dies (or "dice") under realistic field conditions during the manufacturing production cycle to ensure operability. This testing is done prior to singulation of the dies from a wafer. Furthermore, instead of using costly external test patterns to test memory locations, it is desirable to use the BIST circuitry with external ATE. The external tester is programmed to "test" a die's embedded memory by examining the outputs of the its BIST circuitry.

With stand-alone memory devices, manufacturers use dedicated memory ATEs to test them over a range of conditions. Typically, a worst set of operating conditions is applied and any detected faults, if possible, are repaired using fuse structures. This approach may not work for integrated circuits incorporating embedded memories and BIST/BISR capabilities, as test and repair routines are generally executed only at power-up.

Running current BIST algorithms may not adequately detect memory locations having faults that are dependent on operating conditions. Even with BIST/BISR, memory elements can pass power-up BIST under one set of conditions, only to fail during normal operation when the die is subsequently subjected to another set of conditions. Since BIST/BISR is typically run only once during a power cycle, any memory locations that fail after power-up may not be repaired. Such failures may cause the chip to be unsuitable for its intended use.

Prior methods fail to introduce realistic field conditions or stress factors (e.g., normal variation in voltage, timing, power supply disturbances and temperature) during these tests to insure adequate fault coverage. Consequently, suspect memory locations that pass under an initial set of operating conditions but fail under a subsequent set of operating conditions may not be identified by current production test programs. Further, since BISR structures have a limited number of redundant memory locations, a device may be repairable only under select operating conditions.

Current repair approaches involves comparing the repair solutions obtained under different condition either internally to the chip or externally by storing individual repair solutions. Internal comparison is undesirable since it increases the silicon area required to implement the comparison hardware. External comparison is likewise unattractive due to the difficulty of storing and readily accessing different repair solutions externally.

Both comparison methods lead to some loss of yield because of mismatches between the repair solutions. Moreover, an internal comparison is inefficient because it involves a first BIST run to identify the defect, then followed by a second BIST run to verify the repair solution made by the remap operation. All of these steps are associated with only a single operating condition. Obtaining defect data under different conditions would therefore require that this dual-BIST/BISR sequence be repeated. The external comparison requires a BISR run for each of the conditions.

SUMMARY OF THE INVENTION

According to the present invention there is provided an efficient method and system for improving fault coverage and detection during manufacturing testing of integrated circuits having structures such as embedded memories. In one form, a memory array is analyzed for faults using successive iterations of an analysis cycle that involves execution of a stress routine and a test routine.

The stress routine applies stress factors into the memory array. These stress factors may encompass any range of conditions, such as events that are expected to occur normally during regular operations and events that define abnormal or out-of-bounds conditions. For example, the stress factors may represent minimum and maximum values of temperature and voltage.

In one form, the test routine will generate and apply a test pattern to the memory array, retrieve the contents from the memory array, and compare the retrieved data to the original data. For example, in association with a signal set from the test routine (i.e., address information, I/O commands and data), the memory array is configured to receive a read/write signal on a read/write line, receive an address on an address bus, provide data to a data bus when the read/write signal indicates a read operation, and store data (e.g., test pattern) from the data bus when the read/write signal indicates a write operation. The data on the data bus is stored in a memory location specified by the address. The results from the test routine indicate any faulty memory address locations in the memory array.

Each iteration of the analysis cycle therefore involves the application of a specified set of stress factors to the memory array and the execution of a test routine. Preferably, the test routine is conducted by built-in self-test (BIST) circuitry. The BIST module or other such testing process preferably also tests the redundant memory locations that are made available for use in facilitating a repair solution. The test process may implement any suitable test algorithm to facilitate the testing of any selectively designated memory space.

According to a preferred feature of the invention, an accumulator is provided that cumulatively stores the fault information provided by the BIST circuitry during each iteration of the BIST run. Thus, the accumulator maintains a running record (i.e., continuous aggregation) of all of the faulty memory address locations identified by the BIST circuitry over the succession of BIST runs which form part of the fully analysis cycle. It is preferred that the stress factors affecting the memory array be selectively changed for each iteration.

Each iteration of the analysis cycle also includes a functionality that maintains an updated count of the faulty memory address locations identified by the BIST circuitry. This fault count is compared to a repair count (i.e., redundant memory count) indicating the available number of good redundant memory locations. If the fault count exceeds the redundant memory count, the memory array is flagged unrepairable and the testing may be suspended or terminated. Otherwise, a next iteration of the analysis cycle is directed to proceed.

Following completion of the last iteration of the analysis cycle, and assuming that the memory array has not been designated unrepairable, the memory array is repaired using the cumulative fault information generated by the BIST circuitry and stored in the accumulator. In one form, a built-in self-repair (BISR) circuitry is configured to remap the faulty memory address locations (as specified by the cumulatively stored fault information) with redundant memory address locations. For example, accesses to the faulty memory locations will be redirected or otherwise rerouted to redundant memory locations.

The accumulator enables a single repair solution to be implemented since the fault information stored in the accumulator represents the complete set of faulty memory address locations identified by the BIST circuitry across the full spectrum of stress conditions. The cumulative storage of faulty memory address locations provides a mechanism by which the complete fault history of the memory array can be maintained and updated throughout the successive iterations of the analysis cycle.

In this manner, for example, a manufacturing test cycle can be carried out in various segments without the loss of previously identified faulty memory locations since the accumulator will maintain the fault information until a reset condition is enabled. If the test cycle is suspended or otherwise interrupted and then later resumed, the accumulator will ensure an accounting of any prior faulty memory locations that preceded the interruption.

The invention, in one form thereof, is directed to a method of testing integrated circuits having built-in self-test circuitry and built-in self-repair circuitry. According to the method, a selectively variable stress condition is established in an integrated circuit die. A built-in self-test operation is performed to detect faults in at least a portion of the integrated circuit die, e.g., a selectively predetermined portion of the die. Fault information is generated relating to any faults detected by the built-in self-test operation. The fault information is cumulatively stored. The method further involves iteratively repeating the stress condition establishing step, the built-in self-test operation performance step, the fault information generation step, and the fault information cumulative storage step.

The method, in one form, further includes providing a storage area for use in cumulatively storing the fault information, and resetting the storage area. The storage area is reset prior to storage of fault information associated with initial performance of the built-in self-test operation.

In another form, a fault count is defined based upon the cumulatively stored fault information. This fault count is then compared to a repair count. The integrated circuit die is rejected if the fault count exceeds the repair count, as indicated by the comparison operation. In one form, the fault count relates to faulty memory locations, and the repair count relates to the available number of good redundant memory locations.

The method, in another form, further includes performing a built-in self-repair operation to reconfigure any faulty portions of the integrated circuit die as indicated by the cumulatively stored fault information. The built-in self-repair operation preferably follows completion of the last testing iteration. This repair-type reconfiguration, for example, may involve remapping the memory address locations represented by the cumulatively stored fault information to redundant memory address locations.

The built-in self-test operation, in one form thereof, involves generating a test pattern using the built-in self-test circuitry, and exercising the at least a portion of the integrated circuit die with the test pattern.

The selectively variable stress condition may be established in the integrated circuit die by setting an environmental factor and/or operational factor relative to the integrated circuit die. For example, stress factors relating to temperature and voltage may be introduced into the integrated circuit die.

In a preferred form, the at least a portion of the integrated circuit die experiencing the testing operation includes a memory, such as a dynamic random access memory or a static random access memory.

The invention, in another form thereof, is directed to a method of testing integrated circuits having built-in self-test circuitry and built-in self-repair circuitry. The method involves iteratively performing a test routine. Each iteration of the test routine includes, in combination, functions for establishing a selectively variable stress condition in an integrated circuit die, performing a built-in self-test operation to detect faults in at least a portion of the integrated circuit die, generating fault information relating to any faults detected by the built-in self-test operation, and cumulatively storing the fault information. Following completion of the last test routine iteration, a built-in self-repair operation is performed to reconfigure any faulty portions of the integrated circuit die as indicated by the cumulatively stored fault information.

The invention, in another form thereof, is directed to a method for use with a memory array. The method involves, inter alia, the steps of (i) subjecting the memory array to a selectively variable stress condition; (ii) testing the memory array to detect faulty memory locations therein; (iii) generating fault information indicative of any faulty memory address locations detected by the testing operation; (iv) cumulatively storing the fault information; and (v) iteratively repeating steps (i), (ii), (iii) and (iv).

The method also involves reconfiguring any faulty portions of the memory array as indicated by the cumulatively stored fault information, following completion of the last iteration. Preferably, a built-in self-repair module is provided to conduct the reconfiguration operation.

The testing function is preferably performed by a built-in self-test module.

The invention, in another form thereof, is directed to a system for use with a memory array. The system includes a stress applicator that is configured to selectively stress the memory array. A test module is configured to test at least a portion of the memory array to detect faults therein and to provide fault information relating to any detected faults. The stress applicator and test module are configured further to operate in iterative repetition according to a test cycle. An accumulator is configured to cumulatively store the fault information provided by the test module.

A repair module is being configured to remap memory address locations represented by the cumulatively stored fault information to redundant memory address locations. In one form, the repair module includes a built-in self-repair circuit.

The system further includes a first means to define a fault count based upon the cumulatively stored fault information, and a comparator to compare the fault count to a redundant memory count. Preferably, the first means is configured to perform the fault count definition during each operational iteration.

The test module preferably includes a built-in self-test circuit. For example, the circuit may include a generator circuit configured to generate a test pattern, and an applicator circuit configured to apply the test pattern to the memory array.

The stress applicator, in one form, includes a means to selectively establish an environmental condition and/or an operating condition relative to the memory array. For example, stress factors relating to temperature and voltage may be applied to the memory array.

The invention, in another form thereof, is directed to a system for use with a memory array. The system includes a built-in self-test circuit operatively coupled to the memory array. The built-in self-test circuit is configured to test at least a portion of the memory array to detect faults therein and to provide fault information relating to any detected faults. A control means is configured to direct the built-in self-test circuit to perform iterative testing of the memory array. An accumulator is configured to cumulatively store the fault information provided by the built-in self-test circuit.

The system further includes a stress applicator that is configured to selectively stress the memory array. The control means is configured further to direct the stress applicator to perform iterative stressing of the memory array in association with iterative testing of the memory array by the built-in self-test circuit.

A built-in self-repair circuit is configured to remap memory address locations represented by the cumulatively stored fault information to redundant memory address locations.

The invention, in another form thereof, is directed to a system for use with a memory array. The system includes an analysis system operatively coupled to the memory array. The analysis system is configured to analyze the memory array in selectable iterative fashion. The analysis system includes a stress subassembly and a test subassembly. The stress subassembly is configured to selectively stress the memory array. The test subassembly is configured to test at least a portion of the memory array to detect faults therein and to provide fault information relating to any detected faults. An accumulator is configured to cumulatively store the fault information provided by the test subassembly.

The system further includes a repair subassembly that is configured to remap memory address locations represented by the cumulatively stored fault information to redundant memory address locations. In one form, the repair subassembly includes a built-in self-repair circuit. Moreover, the test subassembly, in one form, includes a built-in self-test circuit.

One advantage of the present invention is that a single BIST process can be run under all of the proposed stress conditions.

Another advantage of the present invention is that repair information (i.e., faulty/defective memory address locations) is accumulated under different stress conditions.

A further advantage of the invention is that the accumulation of all repair solutions ensures that all failure information is covered during the remap mode, enabling repair information to be programmed for parts having different failures under different conditions, which leads to improved yield.

A further advantage of the invention is that a running (accumulated) count of faulty memory address locations is maintained across the entire test cycle duration, providing a more complete picture of the overall defect characteristics of the memory array.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
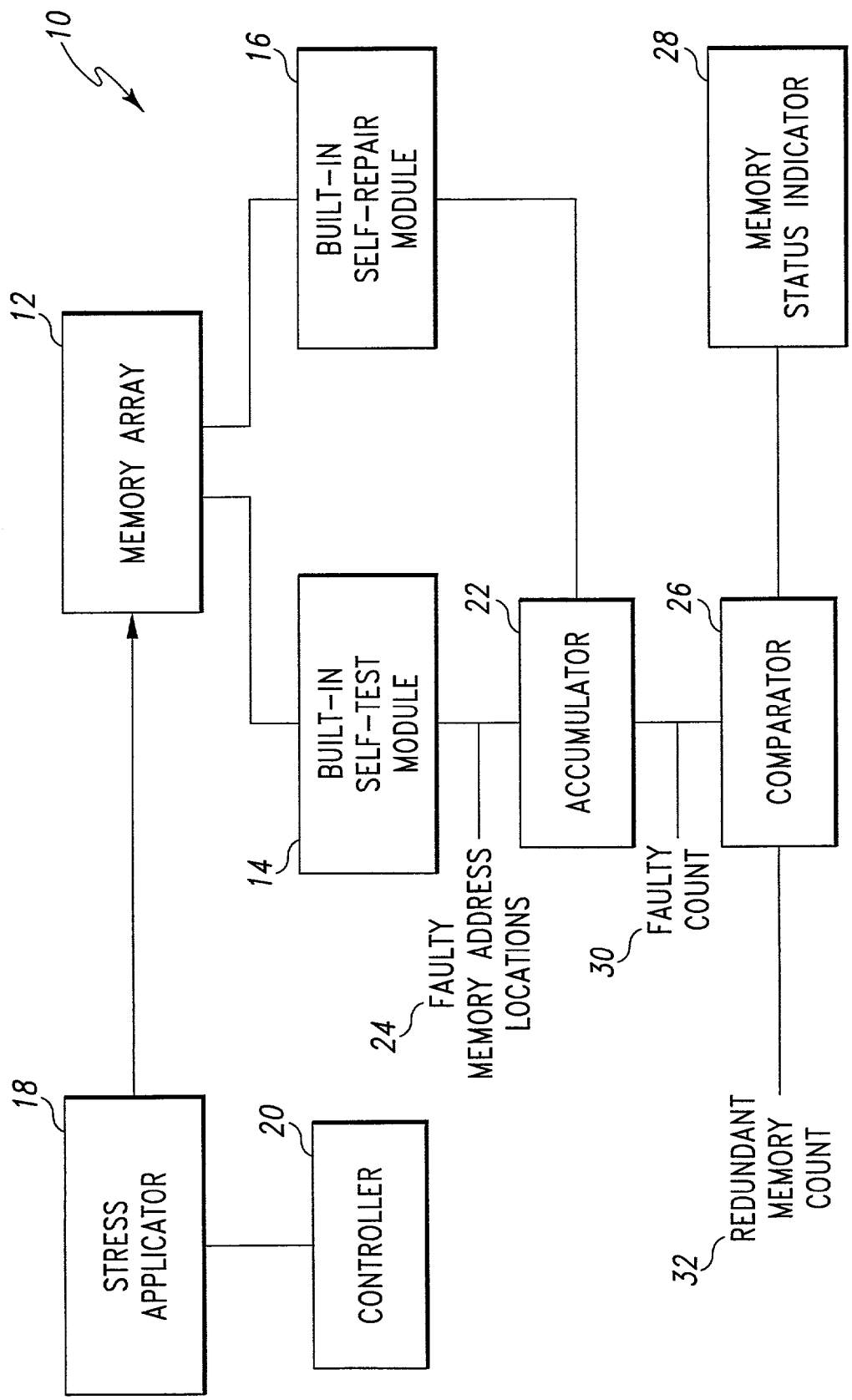
FIG. 1 is a simplified block diagram schematic view of an integrated circuit assembly, according to one embodiment of the present invention.

Referring now to the drawings and particularly to FIG. 1, there is shown a simplified block diagram representation of an integrated circuit (IC) assembly 10 for use in analyzing a memory array 12, according to one embodiment of the present invention. Preferably, IC assembly 10 is used in conjunction with a manufacturing test procedure conducted prior to delivery of the end user machine that incorporates memory array 12. More particularly, the test procedure is preferably performed at the wafer stage prior to singulation. IC assembly 10 finds particular use when memory array 12 is an embedded storage device.

Although IC assembly 10 is described in conjunction with memory array 12, this should not be seen in limitation of the present invention as it should be apparent that the present invention may be practiced with other devices that include, but are not limited to, computer-related modules, logic circuitry, electrical components, and other apparatus having any combination of firmware, software, and hardware.

Additionally, memory array 12 is representative of any type of storage structure and can be configured in any suitable form known to those skilled in the art. Examples of memory array 12 include, but are not limited to, a dynamic random access memory (DRAM), static random access memory (SRAM), and Content Addressable Memory (CAM). Memory array 12 may be a stand alone unit or form part of a larger storage space. Memory array 12 can also be dedicated to any environment that has storage needs, such as a host machine (e.g., central processing unit), peripheral device, and functional devices (e.g., cell phone).

Moreover, for purposes of clarity of description, the illustrated elements of IC assembly 10 are shown in individual functional modular units. However, this modular representation should not be construed in limitation of the present invention, as it should be apparent that the various functional elements may be combined or otherwise organized into any suitable configuration.

For example, the illustrated components may be combined into a single integral device or configured as separate modules interconnected together. In one form, for example, the BIST circuitry and BISR circuitry may be provided as a combined unit. The manner of implementing these various design options employ conventional techniques and therefore would be readily known to one skilled in the art.

Referring specifically to FIG. 1, the illustrated IC assembly 10 includes a built-in self-test (DIST) module 14, a built-in self-repair (BISR) module 16, a stress applicator 18, and a controller 20.

According to one feature of the present invention discussed further herein, IC assembly 10 further includes an accumulator 22 for cumulatively storing the faulty memory address locations 24 supplied thereto by BIST module 14 during successive BIST runs, which are carried out as part of an overall memory test cycle. Accumulator 22 is preferably configured with a comparator 26 and memory status indicator 28 to perform tasks in relation to the cumulatively stored fault information. Comparator 26 receives a fault count 30 based upon the contents of accumulator 22.

In brief functional overview, the illustrated BIST module 14 performs a test process on memory array 12 to detect any faults. For example, in one form, the BIST process applies a test pattern to memory array 12 in a write operation, retrieves the contents of the written memory address locations in a read operation, and compares the retrieved data to the original data represented by the test pattern. The results of the comparison operation indicate the identity of any faulty memory address locations 24.

As discussed further, BIST module 14 typically employs a state machine controller, address generator, and data generator to detect defects that include, but are not limited to, column faults, row faults, bridging faults, stuck-at faults, retention faults, or any combination thereof. These components produce a data pattern that provides optimal fault coverage in identifying the faulty memory cells. In various forms, memory faults may be detected by performing separate tests, i.e., a column lines test, a row lines test, a bridging test, a data storage test, and a data retention test.

The illustrated BISR module 16 serves generally to reconfigure any faulty portions of memory array 12 identified by BIST module 14. For example, BISR module 16 uses the fault information (i.e., faulty memory address locations 24) generated by BIST module 14 and cumulatively stored in accumulator 22 to remap the faulty memory address locations 24 to redundant memory address locations. This remapping function may utilize redundant memory element provided in memory array 12 or obtained from any other storage space, such as a discrete back-up storage structure (not shown) specifically dedicated to this purpose.

As a result of the remap, subsequent accesses to the faulty memory address locations 24 will be redirected or otherwise rerouted to the corresponding redundant memory address locations. This remap is conducted seamlessly and transparently from the perspective of the high-level machine functions, e.g., application programs. The remap (as well as the DIST process) can be carried out with respect to column and row faults caused by defective bit lines and defective word lines, respectively. However, it should be apparent that memory array 12 can be examined by any other suitable BIST/BISR process, such as a cell-by-cell analysis.

It should be apparent that the indicated configurations of BIST module 14 and BISR module 16 are provided for illustrative purposes only and should not be considered in limitation of the present invention. Any suitable BIST/BISR process and implementation may be used to practice the invention.

Examples of various BIST/BISR configurations may be found in U.S. Pat. Nos. 5,764,878, 5,577,050, 5,987,632, and 6,255,836, assigned to the same assignee of the present invention and incorporated herein by reference thereto. It should be understood that the testing and repair procedures performed in relation to memory array 12 may be conducted in any suitable fashion known to those skilled in the art. Accordingly, the specific BIST and BISR protocols discussion herein are merely illustrative and should not be considered in limitation of the present invention.

For example, the BIST process may employ any suitable testing algorithm to implement the relevant memory testing. In one preferred form, the redundant memory space associated with the repair operation of BISR module 16 forms part of the target memory area that is tested by BIST module 14. For example, the available redundant memory space may be examined during one, several, or preferably all of the BIST run iterations.

Accordingly, fault information generated by each BIST run may also indicate faulty redundant memory address locations. The derived fault count will then also reflect any such faulty redundant memory locations. Thus, the repair solution implemented by BISR module 16 will preferably also repair any faulty redundant memory address locations.

It should be apparent that each BIST run can be selectively configured to provide any suitable test pattern encompassing any desired memory coverage area. This manner of controlling the characteristics of the BIST algorithms is well known to those skilled in the art.

Moreover, although the preferred implementation employs BIST and BISR technology, this feature should not be considered in limitation of the present invention, as other suitable testing and repair technologies may be practiced with the present invention.

The BIST process carried out by BIST module 14 preferably occurs in correlation to certain state conditions of memory array 12. In particular, the BIST process examines the integrity of memory array 12 while being subjected to various stress conditions. For this purpose, stress applicator 18 is provided in combination with controller 20 to develop various selective stress conditions within and affecting memory array 12.

The illustrated stress applicator 18 may be provided in any suitable form configured to selectively apply any number of various stress factors to memory array 12 to establish a stress condition or state. These stress factors, for example, may represent the full range of expected field conditions that memory array 12 could potentially encounter. In a preferred form, the stress factors would correspond to the extreme values of various parameters, e.g., minimum and maximum parameter levels.

As used herein, these stress factors, stress conditions, and other stress-related events should be considered to encompass any condition, state or event. For example, stress factors could include, but are not limited to, one or more environmental or operating conditions, such as temperature, voltage, timing, and power supply disturbances.

Stress applicator 18, in one form, may introduce a stress condition representative of a regular normal operating condition, where the stress factor parameter(s) are set with their nominal values/ranges according to vendor specifications, for example. Alternatively, stress applicator 18 may introduce a stress condition characterized by stress factor parameter settings that represent abnormal or irregular conditions characterized by out-of-bounds stress factor levels (e.g., beyond vendor recommended range) or at the extremes of the recommended range.

One skilled in the art would recognize that a stress factor or stress condition may also include a combination of factors, such as temperature and humidity, temperature and voltage, and speed and voltage, for example. In one scenario, for example, temperature and voltage may be applied to the die under minimum/maximum conditions. A BIST run would then be executed when the die is subjected to minimum temperature and maximum voltage, while a subsequent BIST run would involve maximum temperature and minimum voltage. Consequently, the integrated circuit would be subjected to a spectrum of varying-level stress factors and tested under these various conditions to ensure that reliable integrated circuits are shipped to the customers.

For purposes of managing the introduction and maintenance of stress conditions, there is provided controller 20 to direct operational control of stress applicator 18. For example, controller 20 would issue suitable commands to alter voltage and temperature level settings. Additionally, controller 20 could issue suitable commands to activate various stress-generating components. Controller 20 also is configured to direct stress applicator 18 to concurrently introduce any combination of stress factors.

It should be understood that stress applicator 18 encompasses the apparatus needed to implement the various stress conditions. For example, stress applicator 18 may be configured with a power supply, current generator, humidifier, and an AC/heating element equipped with a controllable thermostat.

In accordance with one advantageous feature of the present invention, accumulator 22 is provided to receive and cumulatively store fault information (i.e., faulty memory address locations 24) generated by BIST module 14 from BIST runs performed in relation to memory array 12.

As discussed further, IC assembly 10 preferably operates to execute a testing cycle on memory array 12 that is implemented in the form of an iterative succession of BIST runs each accompanied by a corresponding stress condition established by stress applicator 18. A more detailed discussion of the test cycle process is provided by the flowchart of FIG. 4 in conjunction with the embodiment shown in FIG. 2.

Each iteration of the testing cycle involves a BIST run performed by BIST module 14 that identifies faulty portions of memory array 12. The faulty memory address locations 24 from each BIST run are loaded into accumulator 22 for cumulative storage therein. Subsequent BIST runs will therefore update accumulator 22 with any newly identified faulty memory cells. The fault information pertaining to any matching (i.e., previously identified) faulty cells obviously remains in accumulator 22.

Accumulator 22 therefore retains a complete history of the fault analysis results obtained from the various BIST runs that make up the overall testing cycle. Accumulator 22 may be provided in any suitable form, but preferably is implemented as some type of non-volatile memory so that a power shut-off or interruption will not cause any loss of the cumulative fault information. This allows the testing cycle to be suspended and then later resumed without any loss or degradation in the fault information.

Accumulator 22 is preferably configured with comparator 26 and memory status indicator 28. During each iteration of the memory testing cycle, a fault count 30 is derived from the cumulatively stored fault information as adjusted/updated by the current BIST run iteration. Fault count 30 represents the current number of cumulative faulty memory locations. Comparator 26 compares this fault count 30 to a redundant memory count value (e.g., redundant memory count 32) representing the number of good (i.e., non-faulty) redundant memory address locations that are currently available vis-à-vis the eventual repair operation to be conducted BISR module 16.

As indicated above, BIST module 14 preferably tests the redundant memory address locations reserved or otherwise specified for use in the eventual repair process associated with BISR module 16. Accordingly, the number of good redundant memory address locations available for the repair operation may change from one BIST run iteration to the next. For this purpose, a mechanism (not shown) is provided that appropriately updates redundant memory count 32 with any changes thereto based upon the detection and identification of any faulty redundant memory address locations by BIST 14.

If comparator 26 indicates that the fault count 30 exceeds the redundant memory count 32, this condition triggers memory status indicator 28 to flag the part (i.e., memory array 12) as non-repairable. Otherwise, the memory testing cycle can proceed to the next testing iteration whereby the stress application procedure and BIST process are repeated.

Once the testing cycle has finished, the cumulative fault information stored in accumulator 22 is forwarded to BISR module 16 to perform the remapping function. As seen, the cumulative storage of the faulty memory address locations 24 enables a single BISR operation to be performed. This functional mode distinguishes over schemes where the BISR operation is performed on an interim basis following each BIST run, which is then followed by another BIST run to verify the integrity of the remapped memory address locations. In the invention, the single comprehensive BISR operation can be followed by a comprehensive BIST verification run.

A mechanism (not shown) is preferably provided to reset accumulator 22 to a default value or clear/empty condition in preparation for a new memory testing cycle. Any suitable means conventionally known to those skilled in the art may be used to implement this reset function.

It should be apparent that the overall governance and operational control of IC assembly 10 may be provided by any suitable means conventionally known to those skilled in the art. For example, a software-based test driver may provide a programmatic approach to defining and executing the protocol of the desired memory testing cycle. For this purpose of programmed automation, it is apparent that IC assembly 10 would be conventionally configured with suitable control lines, data bus, and interconnections to facilitate central or host control of the various components.

The various protocol parameters that may be programmed include, but are not limited to, the number of iterations in the testing cycle, the specific BIST algorithm, the stress condition for each iteration (e.g., type of stress and level settings therefor), and the available number of redundant memory elements. Additionally, the specific portion of memory array 12 to be tested may also be programmed.

Preferably, IC assembly 10 is configured to facilitate a fully-automated testing cycle. In this manner, the relevant test routine embodying the test cycle specification would simply be invoked or otherwise activated to initiate a complete testing cycle. A facility may also be provided to enable user interaction at any point during the testing cycle. For example, a control mechanism may be used to enable the user to make on-the-fly adjustments to any of the protocol parameters, such as the stress condition settings. Alternatively, a fully manual or combined manual-automatic mode may be employed.

Figure 2:
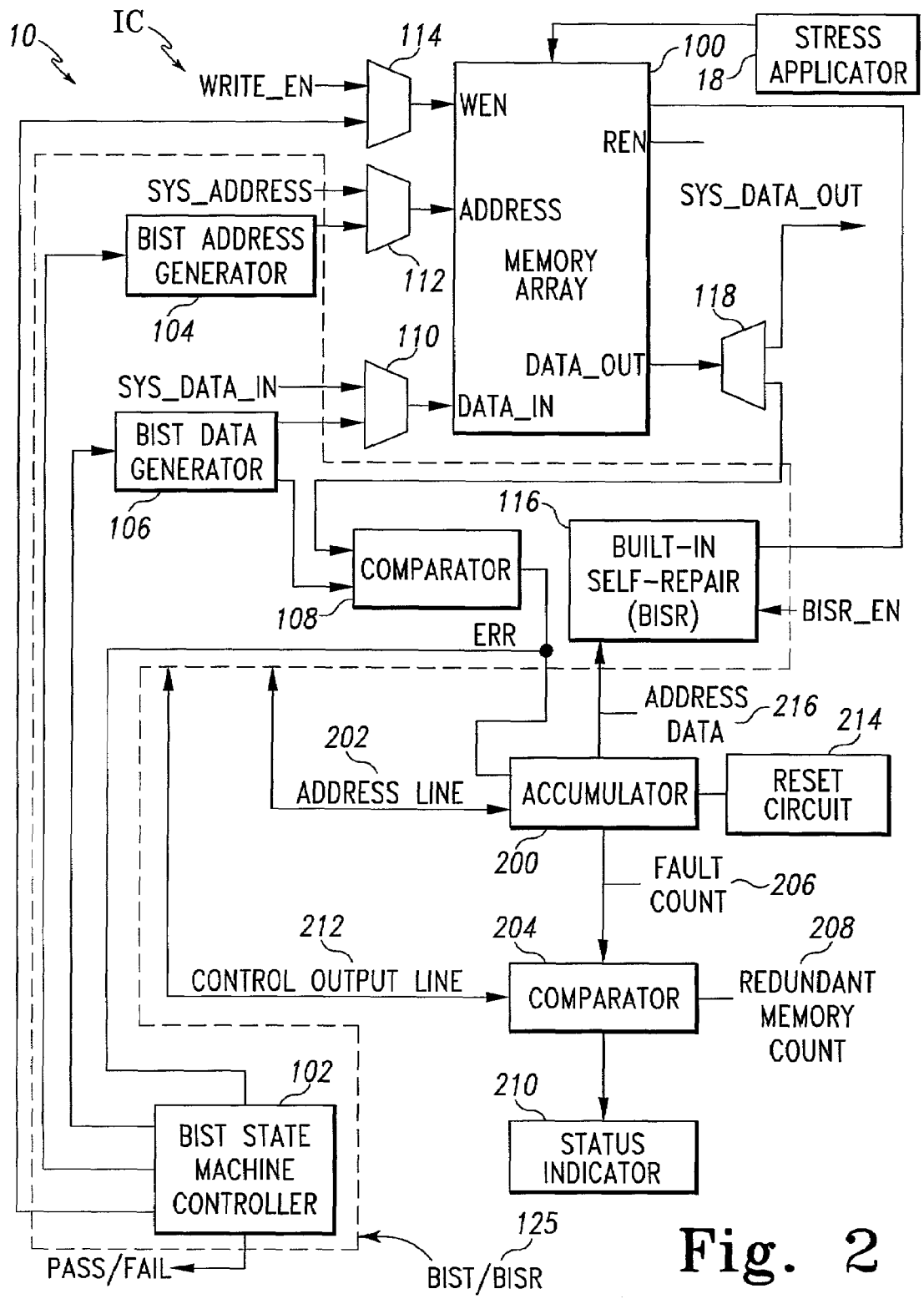
FIG. 2 is a more detailed block diagram schematic view of the IC assembly of FIG. 1, according to another embodiment of the present invention.

Referring now to FIG. 2, there is shown an illustrative implementation of IC assembly 10 of FIG. 1, according to another embodiment of the present invention. In particular, FIG. 2 provides a simplified schematic diagram of an integrated circuit IC incorporating testing capabilities according to the present invention.

The illustrated system includes a built-in self-test (BIST) state machine/controller 102 for controlling the various other components of the disclosed memory BIST system; a built-in self repair (BISR) circuit 116; and a memory array 100. In addition to the BIST state machine/controller 102, other components of the BIST circuitry include an address generator 104, a data generator 106, a comparator 108, and multiplexers 110, 112, and 114 and demultiplexer 118.

In the disclosed embodiment, memory array 100 may be a dynamic random access memory (DRAM), a static random access memory (SRAM), a read-only memory (ROM), or any other type of circuitry having a structured array(s) of elements.

The BIST circuitry functions generally to generate and execute test patterns for detecting column and row faults, for example, in memory array 100. The BISR circuitry 116 is coupled to memory array 100 to repair detected column and/or row faults by any of a number of well-known techniques, including redirecting the original address locations of faulty memory lines to the mapped address locations of redundancy lines.

More particularly, the BIST state machine/controller 102 includes test pattern generator 106 to generate test pattern algorithms used to detect various types of memory faults, including column line faults, row faults, and retention faults. The test pattern generator 106 is preferably configured to produce a pattern that provides optimal fault coverage in identifying faulty memory cells. A memory BIST process for use with the present invention can be implemented in several different ways, including a simple one-pass process (which only provides pass/fail information) to complex, multi-pass systems with several diagnostic modes.

In one illustrative form of the system, BIST/BISR 125 is configured to selectively implement one of two main types of deterministic memory test pattern algorithms: a "march" test and a "neighbor pattern sensitive" test. Either one of these tests (or others) could be utilized in an integrated circuit IC according to the present invention.

The march test generally refers to a finite sequence of tests performed on each cell in memory array 100. All of the cells of memory array 100 are subjected to the same test, and memory cells are tested in either forward or reverse order. March tests are capable of covering all address faults, stuck-at faults, independent coupling faults, linked coupling faults, transition faults, and transition faults linked with coupling faults.

Neighbor pattern sensitive tests involve testing every cell of memory array 100 in relation to the set of neighboring cells, including a base cell. These tests generally require more time to run than march tests, and are capable of covering active, passive, and static neighborhood pattern sensitive faults. Such faults may include stuck-at faults and all coupling and transition faults between physically adjacent memory cells.

Since very little external equipment is necessary to test integrated circuit components covered by BIST circuitry, it is often possible to run these types of tests after the manufacturing process has been completed, allowing end users to periodically test functionality and improve reliability.

In preferred forms, on-chip BIST structures such as BIST state machine/controller 102 typically communicate with external devices via an IEEE 1149.1 compliant interface, for example. When implemented with this interface, IEEE 1149.1 test access port (TAP) and boundary scan structures (not shown) are also present on the integrated circuit IC. When implemented in such a fashion, a simple command sequence initiates BIST operation. After the BIST circuitry has completed its test patterns, the BIST state machine/controller 102 may scan the results to off-chip test equipment via the test access port.

The various outputs of BIST state machine/controller 102 shown in FIG. 2 provide the logical states and inputs for memory array 100 during testing, and are provided in a sequence as specified by a test pattern algorithm. More specifically, BIST state machine/controller 102 provides data inputs and control signals to BIST address generator 104 and BIST data generator 106. The BIST state machine/controller 102 also drives one input to the two-input multiplexer 114, which controls a write enable input WEN of memory array 100.

Separating the BIST state machine/controller 102 and multiplexers 110, 112, and 114 into separate layout blocks minimizes the impact of the BIST circuitry on the routing of the address and input data lines of the integrated circuit IC. Likewise, a demultiplexer 118 routes the memory array 100 output data to either the system during normal operation or to the BIST comparator 108 during BIST operation.

The DATA_IN inputs of memory array 100 are driven by the output(s) of multiplexer 110. The inputs of multiplexer 110 include data bus signals SYS_DATA_IN provided by other components or input pins of the integrated circuit IC. Additional inputs and control signals for multiplexer 110 are provided by BIST data generator 106 as determined by the BIST state machine controller 102. The outputs of BIST data generator 106 are applied to the DATA_IN inputs of memory array 100 (via multiplexer 110) during testing procedures, while the data bus signals SYS_DATA_IN are provided to memory array 100 during normal (i.e., non-testing) operation of the integrated circuit IC.

Similarly, the ADDRESS inputs of memory array 100 are driven by the output(s) of multiplexer 112. The inputs of multiplexer 112 are provided by address bus signals SYS_ADDRESS furnished by other components or input pins of the integrated circuit IC. Additional inputs and control signals for multiplexer 112 are provided by BIST address generator 104. The outputs of BIST address generator 104 thereby control the access points (i.e., address inputs) of memory array 100 during execution of a test pattern algorithm.

Thus, BIST address generator 104 and BIST data generator 106 provide address and data sequences, respectively, to memory array 100 in an order as specified by a test pattern algorithm. Preferably, such sequences provide a set of data bits in a pattern that maximizes fault coverage for detecting various types of faults within memory array 100.

BIST state machine controller 102 drives the write enable input WEN of memory array 100 through multiplexer 114 during testing. A write enable signal WRITE EN may be provided by other integrated circuit IC components or input pins to control the WEN input of memory array 100 during normal operation of the integrated circuit IC.

Memory array 100 supplies output data at the DATA_OUT output port in response to a signal at the read enable input REN. During testing, the read enable input REN is driven by BIST state machine controller 102, while during normal operation the read enable input REN is driven by a system read command. The data supplied from the DATA_OUT output port of memory array 100 is routed by multiplexer 118 to either a system destination (as SYS_DATA_OUT signal) or as a feedback signal to comparator 108 to complete the BIST analysis for the current write-read cycle.

During testing, data patterns communicated to memory array 100 by the BIST circuitry (i.e., DIST data generator 106) are propagated through memory array 100 to DATA_OUT outputs. Under BIST operation, these outputs are routed by demultiplexer 118 for loading into comparator 108, which compares the outputs of memory array 100 on a read cycle against the corresponding binary bits produced by BIST data generator 106 on the associated initiating write cycle.

More particularly, after DATA_IN data from BIST data generator 106 has propagated through memory array 100 as part of a write-read sequence, a DATA_OUT signal is fed back to comparator 108. In response, comparator 108 compares data DATA_IN on the write cycle against data DATA_OUT on the read cycle and provides a comparison result in the form of output signal ERR.

For example, if there is no difference between DATA_IN and DATA_OUT, then the error signal ERR is not asserted. However, if there is a difference, the ERR signal is asserted to indicate that a fault has been detected at that particular memory location. This error condition is communicated both to accumulator 200 and BIST state machine controller 102.

Accumulator 200 interprets the asserted ERR signal driven by comparator 108 as a load command or other suitable write enable signal that stores the address information appearing on address line 202 connected to BIST/BISR 125. The operation of BIST/BISR 125 will be coordinated with this storage mode of accumulator 200 to ensure that the occurrence of an asserted ERR signal from comparator 108 will cause BIST/BISR to download the memory address location associated with this detected error condition on address line 202.

For example, since BIST state machine controller 102 is configured to receive the ERR signal, controller 102 can be programmed to load the address of the relevant faulty memory location onto address line 202 in response to the ERR signal. In this manner, the address of the faulty memory location identified by the BIST circuitry will be transmitted to accumulator 200, which is synchronized to receive and store the downloaded address data. Alternately, accumulator 200 may operate in a passive continuous-load state that automatically stores any address data appearing on address line 202, without any prompting from a load command (i.e., ERR signal).

Comparator 204 is configured to compare the fault count 206 of the current test cycle to a redundant memory count 208 to determine if the testing cycle can proceed to another iteration or if the part must be designated as unrepairable. Fault count 206 represents the total number of identified faulty memory address locations, as indicated by the cumulatively stored fault information maintained by accumulator 200.

Redundant memory count 208 represents the available number of good redundant memory address locations. In operational modes where the BIST process also examines the redundant memory space, the BIST/BISR module 125 will preferably provide a functionality that enables redundant memory count 208 to be dynamically updated based upon the results of the individual BIST runs, namely, whether any faulty redundant memory address locations have been detected. It is therefore the case that the fault information cumulatively stored in accumulator 200 also reflects the detection of any faulty redundant memory address locations. Any suitable means well known to those skilled in the art may be used to implement this updating functionality.

The outcome of the comparison operation performed by comparator 204 is furnished to status indicator 210, which may communicate in any suitable format the current status of the memory testing cycle, namely, pending (memory array still considered repairable based on the most recent testing iteration), terminated (memory array unrepairable), or completed (testing cycle finished and memory array repairable).

The comparison results and memory status may be furnished to BIST/BISR 125 (e.g., BIST state machine controller 102) on control output line 212.

A controllable and/or programmable reset circuit 214 is preferably provided to selectively reset accumulator 200, such as at the beginning of a new testing cycle.

Stress applicator 18 is operatively configured with memory array 100 in a manner similar to that set forth in FIG. 1. Accordingly, stress applicator 18 provides functions similar to those described in connection with memory array 12 of FIG. 1.

BIST/BISR 125 includes BISR 116 to perform the repair procedure on the faulty portion(s) of memory array 100 detected by the succession of BIST runs. The BISR process is invoked in response to a repair enable signal BISR_EN provided at a control input thereof. This enable signal, for example, could be furnished by BIST state machine controller 102 following completion of the last iteration of the BIST runs. BISR 116 performs its remapping operation on the faulty memory address locations cumulatively stored in accumulator 200 and forwarded to BISR 116 on address data line 216.

Figure 3:
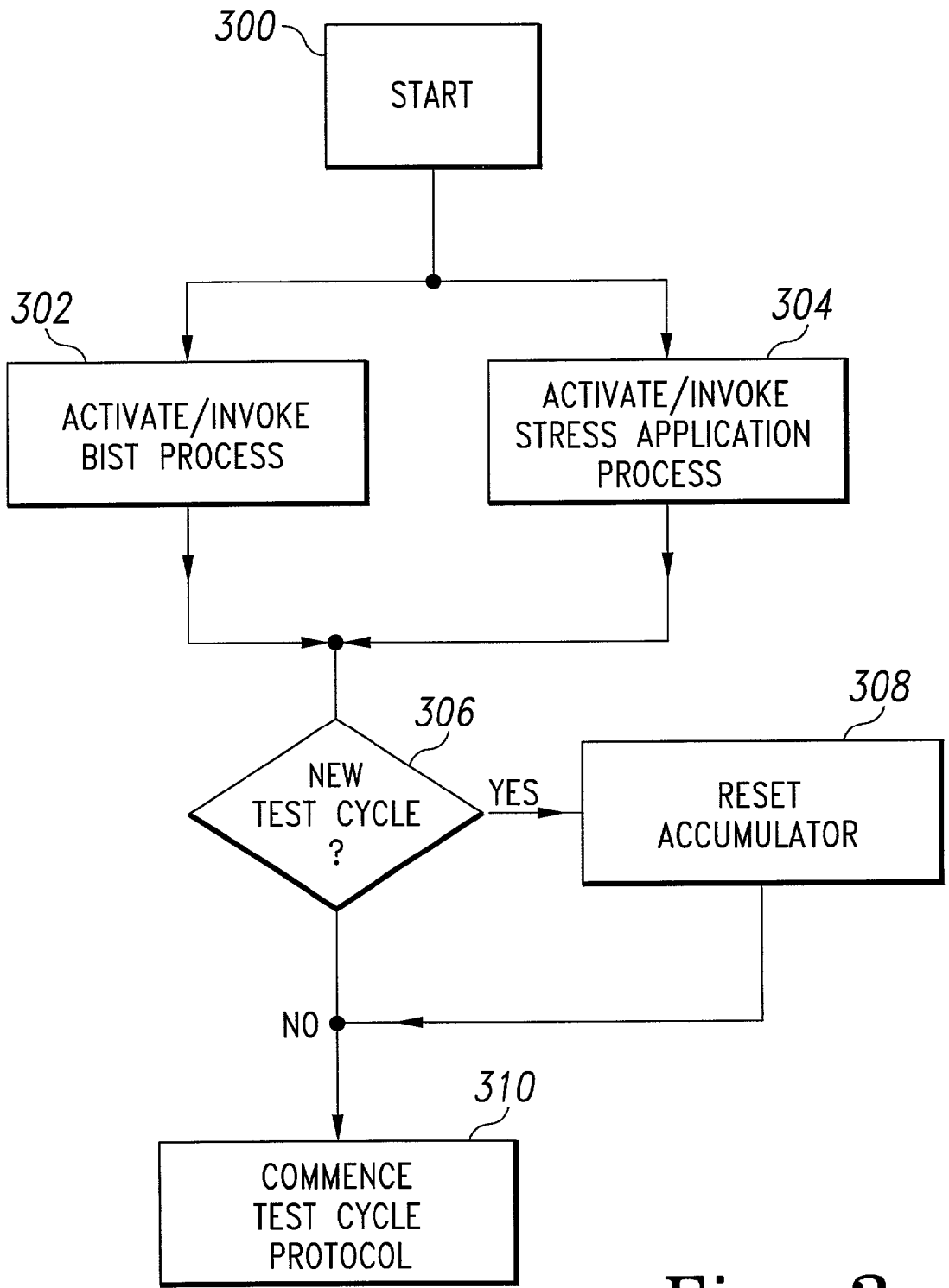
FIG. 3 is a flowchart detailing an initialization routine for use in practicing the invention in connection with the IC assembly of FIG. 2.
Figure 4:
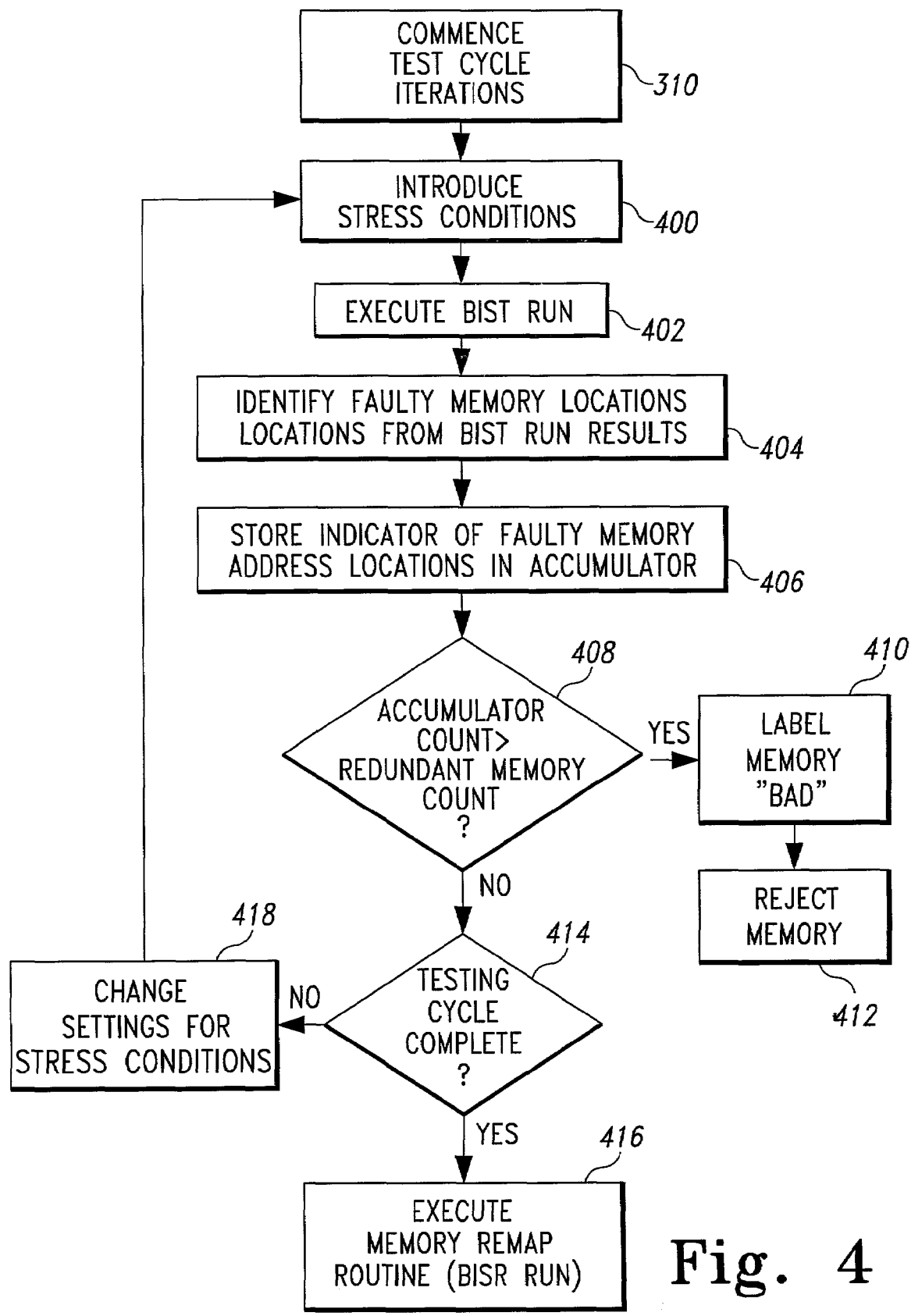
FIG. 4 is a flowchart detailing a memory testing cycle for use in practicing the invention in connection with the IC assembly of FIG. 2.

Referring now to FIGS. 3 and 4, there are provided flowcharts for detailing the protocols involved in executing an initialization routine and test cycle routine, respectively, in accordance with the present invention. These routines describe in broad representative form the manner of practicing the systems shown in FIGS. 1 and 2. Where appropriate, reference will also be made to FIG. 2 to identify the components that perform the related functional steps of the routines.

Referring first to FIG. 3, the indicated flowchart describes an initialization sequence preceding the actual test cycle protocol, which involves the iteratively repeated BIST runs, continuous fault information accumulation, and final BISR run.

The test module is initially launched by any suitable command, such as a user prompt, system signal, or external command (e.g., from external automated test equipment). (Step 300). The launch process effectively "opens" or activates the BIST/BISR module so that the BIST process is prepared for execution. (Step 302). For example, a launch signal could be received by BIST state machine controller 102 (FIG. 2). At the same time, the stress applicator 18 is also activated, e.g., powered-up and configured with any stress factor data furnished thereto. (Step 304).

A determination is then made as to whether the current impending BIST/BISR process (in combination with the stress application process) relates to a new test cycle or represents a resumption in a previously suspended cycle or continuation of a pending test cycle, for example. (Step 306). If a new cycle is being initiated, accumulator 200 is reset so that the cumulative fault information stored therein relates only to the new test cycle. (Step 308). Otherwise, the individual iterations of the test cycle sequence are commenced. (Step 310).

At this point, in particular, BIST state machine controller 102 and stress applicator 18 are directed to execute their respective functions in coordinated fashion, while accumulator 200 cumulatively stores the faulty memory address locations identified by each BIST run iteration.

Referring now to FIG. 4, the flowchart illustrates the various steps that are undertaken as part of the memory test cycle. After the test cycle routine has been launched (step 310), stress conditions are introduced into memory array 100 by stress applicator 18. (Step 400). Next, a BIST run is executed by BIST state machine controller 102 in connection with memory array 100. (Step 402). The results of the BIST run are used to identify any faulty memory locations detected by the BIST process. (Step 404).

For example, the actual identification of a fault would be indicated by assertion of the ERR signal by comparator 108. BIST state machine controller 102 could then provide the memory address location corresponding to this error condition.

Accumulator 200 cumulatively stores the addresses of any faulty memory locations detected by the BIST process. (Step 406). Significantly, accumulator 200 stores the fault information cumulatively, i.e., it stores and continuously maintains all of the faulty memory address locations detected by each iteration of the BIST process throughout the entire testing cycle. Therefore, at each stage of the testing cycle, accumulator 200 provides an updated and immediately current identification of all existing faulty memory address locations detected up to that point.

If the accumulator count (i.e., cumulative number of faulty memory address locations stored in accumulator 200) exceeds the number of available good redundant memory elements, the memory array is labeled "BAD" and is rejected. (Steps 408, 410, 412).

Otherwise, the system determines if the testing cycle has been completed, namely, whether the last testing iteration has been performed (Step 414). For example, the last iteration could be indicated by completion of a specified number of BIST runs or a specified number of stress conditions.

If the testing cycle is complete, the system proceeds to direct BISR 116 to execute a repair procedure using the fault information cumulatively stored in accumulator 200. (Step 416).

For example, the faulty memory address locations stored in accumulator 200 are forwarded to BISR 116 on address data line 216, which remaps these faulty memory elements to redundant memory address locations.

If the testing cycle is not complete, a next iteration of the cycle is repeated. Preferably, each successive testing iteration will involve a corresponding change in the settings for the stress conditions. (Step 418). After the stress factor settings are changed at the outset of the new iteration, the corresponding as-modified stress condition is established (step 400) and the next BIST run is executed (402). The process repeats iteratively until the testing cycle is complete, at which point the BISR operation is performed.

As shown in FIG. 4, each iteration of the testing cycle preferably involves the selective application of stress factors, the execution of a BIST run, accumulation of faulty memory address locations detected by the BIST run, and a determination as to whether the memory array is currently repairable (proceed to next iteration) or unrepairable (terminate cycle and reject part). These functions are repeated for each iteration.

Notably, only a single BISR operation is performed that comprehensively remaps all of the faulty memory address locations at one time, rather than on a successive basis immediately upon the identification of faulty locations. As a result, the ultimate repair solution covers memory defects that arise under different conditions. This feature is especially useful with parts that are highly sensitive to changing conditions and which therefore experience different failures under different stress conditions. The invention enables the implementation of a single BISR repair solution to cover all of the defects arising from the entire range of expected stress conditions. This feature has obvious advantages over the ad hoc repair solutions found in conventional schemes.

It should be apparent that the various steps shown in FIGS. 3 and 4 may occur in a different order or sequence without departing from the present invention. For example, it is possible to subject the memory array to the stress factors in concurrence with the BIST run, such as during a data retention test when a pause interval occurs between the memory write and memory read operations.

In one example of the test protocol of FIG. 4, a normal initial BISR run is executed under a selected voltage and temperature condition. The accumulator stores the defective addresses, such as word address, row address, or column repair information. Once the initial BIST run is complete, an indication of this completion is generated. At this point, the voltage and temperature conditions can be switched to another setting.

During subsequent BIST runs, the relevant hardware is configured to operate in a continuation mode or repair information accumulation mode. In particular, during the test cycle, no reset signal is applied to the accumulator, since it is necessary for the fault information to be continuously added to and maintained in the accumulator across all of the BIST iterations.

Defects are accumulated until the number of available (good) redundant elements is less than the number of defective elements, at which point the part is flagged as un-repairable. Otherwise, if the testing cycle is completed without the occurrence of the preceding condition, the part is flagged as repairable since a sufficient number of redundant elements are available to repair all of the accumulated defective elements.

Once all repair information is accumulated, a remap mode is executed to remap the defective elements with the available redundant elements.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for use with a memory array, said method comprising the steps of:
   (i) subjecting the memory array to a selectively variable stress condition;
   (ii) testing the memory array to detect faulty memory locations therein;
   (iii) generating fault information indicative of any faulty memory address locations detected by the testing operation;
   (iv) cumulatively storing the fault information;
   (v) defining a fault count based upon the cumulatively stored fault information;
   (vi) comparing the fault count to a redundant memory count; and
   (vii) iteratively repeating steps (i), (ii), (iii), (iv), (v) and (vi).

2. The method as recited in claim 1, further comprises the step of:
   reconfiguring any faulty portions of the memory array as indicated by the cumulatively stored fault information, following completion of the last iteration.

3. The method as recited in claim 1, further comprises the step of:
   remapping the memory address locations represented by the cumulatively stored fault information to redundant memory address locations, following completion of the last iteration.

4. The method as recited in claim 3, further comprises the step of:
   providing a built-in self-repair module to operatively perform the remapping function.

5. The method as recited in claim 1, further comprises the step of:
   repairing the memory address locations represented by the cumulatively stored fault information with redundant memory address locations.

6. The method as recited in claim 1, further comprises the step of:
   providing a built-in self-test module to operatively perform the testing function.

7. The method as recited in claim 6, wherein the testing step further comprises the steps of:
   generating a test pattern using the built-in self-test module; and
   exercising at least a portion of the memory array with the test pattern.

8. The method as recited in claim 1, further comprises the steps of:
   providing a storage area for use in cumulatively storing the fault information; and
   resetting the storage area, prior to storage of fault information associated with a first iteration.

9. The method as recited in claim 1, wherein each iteration further comprises the steps of:
   rejecting the memory array if the fault count exceeds the redundant memory count, as indicated by the comparison operation.

10. The method as recited in claim 1, wherein the fault count relates to faulty memory locations, and the redundant memory count relates to redundant memory locations.

11. The method as recited in claim 1, wherein the step of subjecting the memory array to a selectively variable stress condition further comprises the step of:
    selectively setting at least one of an environmental factor and an operational factor in relation to the memory array.

12. The method as recited in claim 1, wherein the step of subjecting the memory array to a selectively variable stress condition further comprises the step of:
    selectively setting at least one of a voltage condition and a temperature condition of the memory array.

13. The method as recited in claim 1, wherein the memory array includes a dynamic random access memory.

14. The method as recited in claim 1, wherein the memory array includes a static random access memory.

15. A method for use with a memory array, said method comprising the steps of:
    (i) subjecting the memory array to a selectively variable stress condition;
    (ii) testing the memory array to detect faulty memory locations therein;
    (iii) generating fault information indicative of any faulty memory address locations detected by the testing operation;
    (iv) cumulatively storing the fault information;
    (v) identifying a quantity of faulty memory locations corresponding to the cumulatively stored fault information; and
    (vi) comparing the quantity of faulty memory locations to a quantity of redundant memory locations; and
    (vii) rejecting the memory array if the quantity of faulty memory locations exceeds the quantity of redundant memory locations, as indicated by the comparison operation;
    (viii) iteratively repeating steps (i), (ii), (iii), (iv), (v), (vi) and (vii).

16. The method as recited in claim 15, further comprises the step of:
    reconfiguring any faulty portions of the memory array as indicated by the cumulatively stored fault information, following completion of the last iteration.

17. The method as recited in claim 15, further comprises the step of:
    remapping the memory address locations represented by the cumulatively stored fault information to redundant memory address locations, following completion of the last iteration.

18. The method as recited in claim 17, further comprises the step of:
    providing a built-in self-repair module to operatively perform the remapping function.

19. The method as recited in claim 15, further comprises the step of:
    repairing the memory address locations represented by the cumulatively stored fault information with redundant memory address locations.

20. The method as recited in claim 15, further comprises the step of:
    providing a built-in self-test module to operatively perform the testing function.

21. The method as recited in claim 20, wherein the testing step further comprises the steps of:
    generating a test pattern using the built-in self-test module; and
    exercising at least a portion of the memory array with the test pattern.

22. The method as recited in claim 15, further comprises the steps of:
    providing a storage area for use in cumulatively storing the fault information; and
    resetting the storage area, prior to storage of fault information associated with a first iteration.

* * * * *